United States Patent
Hirano

[11] Patent Number: 5,818,300
[45] Date of Patent: Oct. 6, 1998

[54] VARIABLE GAIN AMPLIFIER CIRCUIT WITH REDUCED POWER REQUIREMENTS

[75] Inventor: Yoji Hirano, Tokyo, Japan

[73] Assignee: NEC Corporation, Tokyo, Japan

[21] Appl. No.: 788,443

[22] Filed: Jan. 28, 1997

[30] Foreign Application Priority Data

Feb. 7, 1996 [JP] Japan ................................. 8-020831

[51] Int. Cl.⁶ .................................................. H03F 3/45
[52] U.S. Cl. .......................................... 330/252; 330/254
[58] Field of Search ................................ 330/252, 254, 330/261; 327/359

[56] References Cited

FOREIGN PATENT DOCUMENTS

| 0097712 | 5/1985 | Japan | 330/254 |
|---|---|---|---|
| 0314410 | 12/1989 | Japan | 330/254 |

Primary Examiner—Steven Mottola
Attorney, Agent, or Firm—Whitham, Curtis & Whitham

[57] ABSTRACT

In a differential amplifier formed with first and second transistors having emitters connected to each other via a resistor, an input signal is supplied to a base of the first transistor. On the other hand, to a base of the second transistor, an external constant voltage is supplied. In order to control the emitter current of the second transistor, a third transistor having a base supplied a control voltage is added. The emitter of the third transistor is commonly connected to the emitter of the second transistor in common, and a collector thereof is connected to a high power source voltage terminal. By varying at least one of the control voltage on the base of the third transistor and the constant voltage on the base of the second transistor, a gain of the circuit can be controlled. Also, the transistors are connected in single stage connection with respect to the power source, operation with the low power source voltage becomes possible.

7 Claims, 6 Drawing Sheets

VARIABLE GAIN AMPLIFIER CIRCUIT WITH REDUCED POWER REQUIREMENTS

BACKGROUND OF THE INVENTION

1. Field of the Invention

The present invention relates generally to a variable gain amplifier circuit. More specifically, the invention relates to a variable gain amplifier circuit of bipolar transistor construction capable of high speed operation at low power source voltage.

2. Description of the Related Art

A liquid crystal display device had initially appeared as display device for an electric calculator, a digital watch and so forth. Currently, the liquid crystal display device is rapidly spreading as display device for personal computer, television receiver, wordprocessor and so forth. Particularly, battery driven devices as portable devices are becoming important.

Among these liquid crystal display devices, is an active-matrix type liquid crystal display device which has transistor or diode as active element in each pixel for driving liquid crystal arranged in matrix fashion to perform a kind of data storage function. Such active-matrix type liquid crystal display device has been attracting attention for capability of high quality display with superior contrast. Namely, each active element serves as a switch for turning ON and OFF, so that a display signal is transmitted to a corresponding pixel via the active element in selected (ON) state by a scanning signal, Subsequently, when the active element once selected becomes non-selected (OFF) state, the display signal applied to the pixel is held in a form of charge in each pixel to constantly drive the pixel. As a result, the liquid crystal can reproduce static characteristics in good condition to realize high display quality.

A typical example of the liquid crystal display device of this type is illustrated in FIG. 6. Referring to FIG. 6, an LCD (Liquid Crystal Display) panel 601 has 1280 rows and 1024 columns of active elements. Source drivers 602A and 602B transmit display signal for the active elements in the LCD panel 601. A gate driver 603 transmits a scanning signal to the active elements for controlling ON and OFF states of respective active elements.

Analog signal processing circuits 604R, 604G and 604B receive respective analog input signals of R, G, B for generating the display signal to perform analog signal processing. Data inverting circuits 605R, 605G and 605B generate inverted signals of respective analog input signals to feed to the source drivers 602A and 602B as the display signals, respectively.

A DC—DC converter controls a direct current level of the analog signal processing circuit 604R, 604G and 604B and the data inverting circuits 605R, 605G and 605B. A timing controller 607 receives a clock signal and performs various timing control for respective of the source drivers 602A and 602B, the gate driver 603, the data inverting circuits 605R, 605G and 605B and the analog signal processing circuits 604R, 604G and 604B.

The analog signal processing circuits 604R, 604G and 604B are designed for operation at a high speed clock signal of 107.5 MHz, for example. Therefore, the analog signal processing circuits are provided with high speed variable gain amplifier circuits as component, which variable gain amplifier circuits can sequentially vary the gain without degrading high speed characteristics of the analog input signals. A Gilbert s integration circuit which has been generally known can be employed as the above-mentioned high speed variable gain amplifier circuit.

Referring to FIG. 4 showing an example of construction of the conventional variable gain amplifier circuit, the conventional variable gain amplifier circuit includes a transistor Q10 receiving an input signal VIN at a base and connected to a high potential power source terminal VCC at a collector, and a transistor Q11 receiving a constant voltage V11 at a base. An emitter of the transistor Q10 is connected, via a resistor R11, and an emitter of the transistor Q11 is connected, via a resistor R12, to a circuit node N1, in common to form a differential amplifier circuit 1 with an emitter resistance. Also, the common junction N1 of the resistors R11 and R12 are connected to a constant current source I1.

Also, between the collector of the transistor Q11 and the high potential power source terminal VCC, a gain control circuit 2 is controlled for varying a circuit gain by controlling the collector current of the transistor Q11 by external control voltages V13 and V14.

In the gain control circuit 2, transistors Q13 and Q14 are provided with commonly connected the emitters which are connected with the collector of the transistor Q11. To bases of the transistors Q13 and Q14, constant voltages V13 and V14 are applied, respectively. Then, the collector of the transistor Q13 is directly connected to high potential power source terminal VCC, and the collector of the transistor Q14 is connected to the high potential power source terminal VCC via a load resistor R13.

From the load resistor R13, a circuit output VOUT is lead out.

Next, discussion will be given with respect to gain of the variable gain amplifier circuit of FIG. 4.

Now, reference is made to a basic circuit construction of the differential amplifier circuit with the emitter resistance outputting an output signal VOUT from the collector of the transistor Q11 for obtaining gain of the differential amplifier circuit with the emitter resistance, in order to obtain a fixed gain, the resistor R13 is connected between the collector of the transistor Q11 and the high potential power source terminal VCC. The basic circuit is shown in FIG. 5. With reference to FIG. 5, the gain G0 of the differential amplifier circuit with the emitter resistance can be derived by $$G0 = R13/(R11+R12) \tag{1}$$

Accordingly, the variable gain amplifier circuit shown in FIG. 4 may be a construction of the variable gain amplifier circuit varying the gain by controlling the collector current of the transistor Q11 by a differential circuit 2 constructed by the transistors Q13 and Q14 receiving the constant potentials V13 and V14 at the bases.

The variable gain GX of the variable gain amplifier circuit can be derived from $$GX = \{R13/(R11+R12)\}/\{1 + \exp((q/kT) \cdot (V13 - V14))\} \tag{2}$$

wherein q is a charge of electron, k is a Boltzman's constant, T is an absolute temperature.

By varying the potential between constant potentials V13 and V14, the gain GX of the conventional variable gain amplifier circuit can be sequentially varied from 0 to the maximum value $\{R13/(R11+R12)\}$.

With the construction operating the bipolar transistors Q10 and Q11 as component of the differential amplifier circuit 1 with the emitter resistance in the active region of the bipolar transistors, and with the construction operating the bipolar transistors Q13 and Q14 as the components of the gain control circuit 2 in the active region of the bipolar transistors similarly to the operational region of the differential amplifier circuit 1 with the emitter resistance, the conventional variable gain amplifier circuit is adapted to high speed operation.

However, the conventional variable gain amplifier circuit is necessary to be operated in the active region of the bipolar transistor of the component as set forth above, for effectively using high speed characteristics.

Namely, for operation in the active region of the transistor Q11, it becomes necessary to set a collector-emitter saturation voltage (VCESAT) of the transistor Q11 to be greater than or equal to 1V. Respective constant voltages V13 and V14 has to be set at the voltage higher than or equal to the collector-emitter saturation voltage (VCESAT) of the transistor Q11 with respect to the constant voltage V11. transistor Q11 with respect to the constant voltage V11.

More concretely, it becomes necessary to set the constant voltages V13 and V14 at higher voltage in the extent to 1V than the voltage of the constant voltage V11.

Accordingly, when the output amplitude VL of the output signal VOUT is large, and also for operating the transistor Q11 in the active region, it becomes necessary to set the high potential power source VCC at a voltage to be a sum greater than or equal to the constant voltage V14 and the output amplitude VL. The power source voltage of the variable gain amplifier circuit has to be set at high voltage to cause increasing of power consumption of the variable gain amplifier circuit.

SUMMARY OF THE INVENTION

Therefore, the present invention has been worked out in view of the problems in the prior art as set for above. It is an object of the present invention to provide a variable gain amplifier circuit for lowering power consumption.

Another object of the present invention is to provide a variable gain amplifier circuit having a large output amplitude.

According to the first aspect of the invention, a variable gain amplifier circuit comprises:

a first transistor having a base supplied an input signal, a collector connected to a power source terminal and an a second transistor having a base supplied a first constant voltage, and an emitter connected to the circuit node;

a constant current source supplying a constant current to the circuit node;

a first load provided between a collector of the second transistor and the power source terminal; and a third transistor having an emitter connected to the emitter of the second transistor, a base supplied to a second constant voltage for controlling an emitter current of the second transistor.

In the preferred construction, a circuit gain is controlled by controlling at least one of the first and second constant voltages. The variable gain amplifier circuit may further comprise first and second resistors respectively provided between respective emitters of the first and second transistors and the circuit node. In such case, a collector of the third transistor may be connected to the power source terminal.

Also, the variable gain amplifier circuit may further comprise a second load provided between a collector of the third transistor and the power source terminal, and circuit outputs may be lead out from respective of the first and second loads. The first and second loads may be resistors.

According to the second aspect of the invention, a variable gain amplifier circuit comprises:

a first transistor having a base supplied an input signal, a collector connected to a power source terminal and an emitter connected to a circuit node;

a second transistor having a base supplied a first constant voltage, and an emitter connected to the circuit node;

a constant current source supplying a constant current to the circuit node;

a third transistor having an emitter connected to the emitter of the second transistor, a base supplied to a second constant voltage for controlling an emitter current of the second transistor; and a collector current control circuit connected between the collector of the second transistor and the power source terminal for controlling a collector current of the second transistor depending upon a control voltage.

A circuit gain may be controlled by controlling at least one of the first and second constant voltages and the control voltage. The variable gain amplifier circuit may further comprise first and second resistors respectively provided between respective emitters of the first and second transistors and the circuit node.

The collector current control circuit may include fourth and fifth transistors respectively having emitters connected to the collector of the second transistor, and bases of the fourth and fifth transistors may be supplied third and fourth constant voltages as the control voltages, respectively. Preferably, the variable gain amplifier circuit may further comprise a resistor provided between the collector of the fifth transistor, and a circuit output may be lead out from the resistor.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
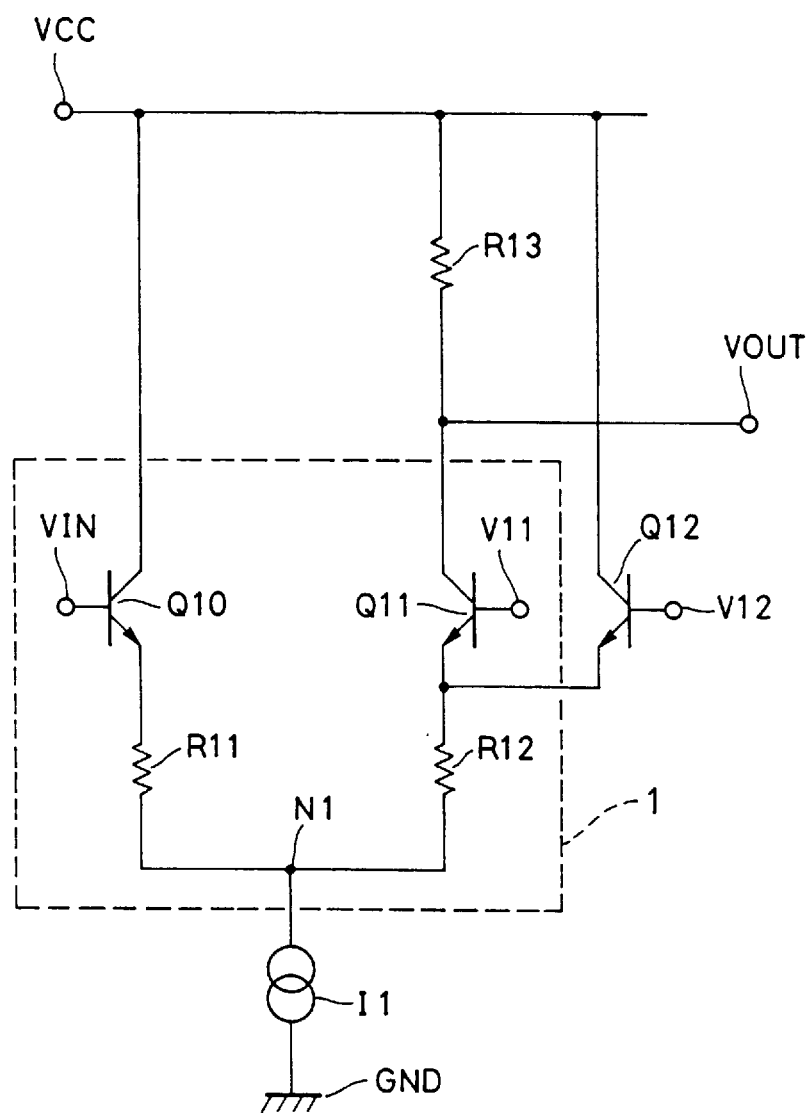
FIG. 1 is a circuit diagram showing a construction of the first embodiment of a variable gain amplifier circuit according to the present invention.

FIG. 1 is a circuit diagram of the first embodiment of a variable gain amplifier circuit according to the present invention. It should be noted that like elements to FIGS. 4 and 5 will be identified by like reference numerals. The shown embodiment is differentiated from the circuit of FIG. 5 in that a transistor Q12 is added for controlling an emitter current of the transistor Q11.

An emitter of the transistor Q12 is commonly connected with the emitter of the transistor Q11, and a collector thereof is directly connected to a high potential power source terminal VCC. A base of the transistor Q12 is applied an external constant voltage V12.

It should be noted that the output VOUT of this circuit is lead out by a collector load resistor R13 of the transistor Q11.

Next, operation of the first embodiment of the variable gain amplifier circuit according to the present invention will be discussed.

At first, upon deriving a gain of the shown embodiment of the variable gain amplifier circuit, the gain G0 is derived in the similar matter to that deriving the gain of the basic circuit construction of the differential amplifier circuit with the emitter resistance as discussed with respect to the conventional variable gain amplifier circuit.

An output voltage VOUT of the basic circuit of the shown embodiment of the variable gain amplifier circuit can be derived from $$VOUT = VCC - R13 \cdot IC \quad (3)$$

Wherein IC is a collector current of the transistor Q11. The gain G0 of the output voltage VOUT relative to the input voltage (VIN−V11) is obtained by differentiating the equation (3) and can be expressed by:

$$\begin{aligned} G0 &= dVOUT/d(VIN - V11) \quad (4)\\ &= d(VCC - R13 \cdot IC)/d(VIN - V11)\\ &= -R13 \cdot \{dIC/d(VIN - V11)\} \end{aligned}$$

Namely, it can be derived from $$G0 = R13/(R11+R12) \quad (5)$$

similarly to the prior art.

Also, the shown embodiment of the variable gain amplifier circuit receives the constant voltage V12 at the base for controlling the emitter current IE11 of the transistor Q11, and the emitter of the transistor Q12 is connected to the emitter of the transistor Q11. Therefore, the emitter current IE11 of the transistor Q11 is subject a current control with a coefficient K, wherein K is expressed by $$K = 1/[1+\exp\{(q/kT)\cdot(V11-V12)\}] \quad (6)$$

As a result, a gain G1 of the shown embodiment of the variable gain amplifier circuit can be derived from $$\begin{aligned} G1 &= K \cdot G0 \quad (7)\\ &= \{R13/(R11+R12)\}/\{1 + \exp((q/kT)\cdot(V11-V12))\} \end{aligned}$$

Comparing the foregoing equations (7) and (2), similarly to the conventional variable gain amplifier circuit, the gain G1 of the gain amplifier circuit can be sequentially varied from 0 to the maximum value R13/(R11+R12).

Also, the variable gain amplifier circuit according to the present invention can be constructed in single stage while the conventional variable gain amplifier circuit is constructed in two stage construction. Therefore, the base potential of the transistor Q11 can be set to be lower than the base potential V11 of the circuit of FIG. 4 in the extent of 1V.

As a result, the power source voltage in battery driving can be lowered for 1V to reduce power consumption of the variable gain amplifier circuit.

Figure 2:
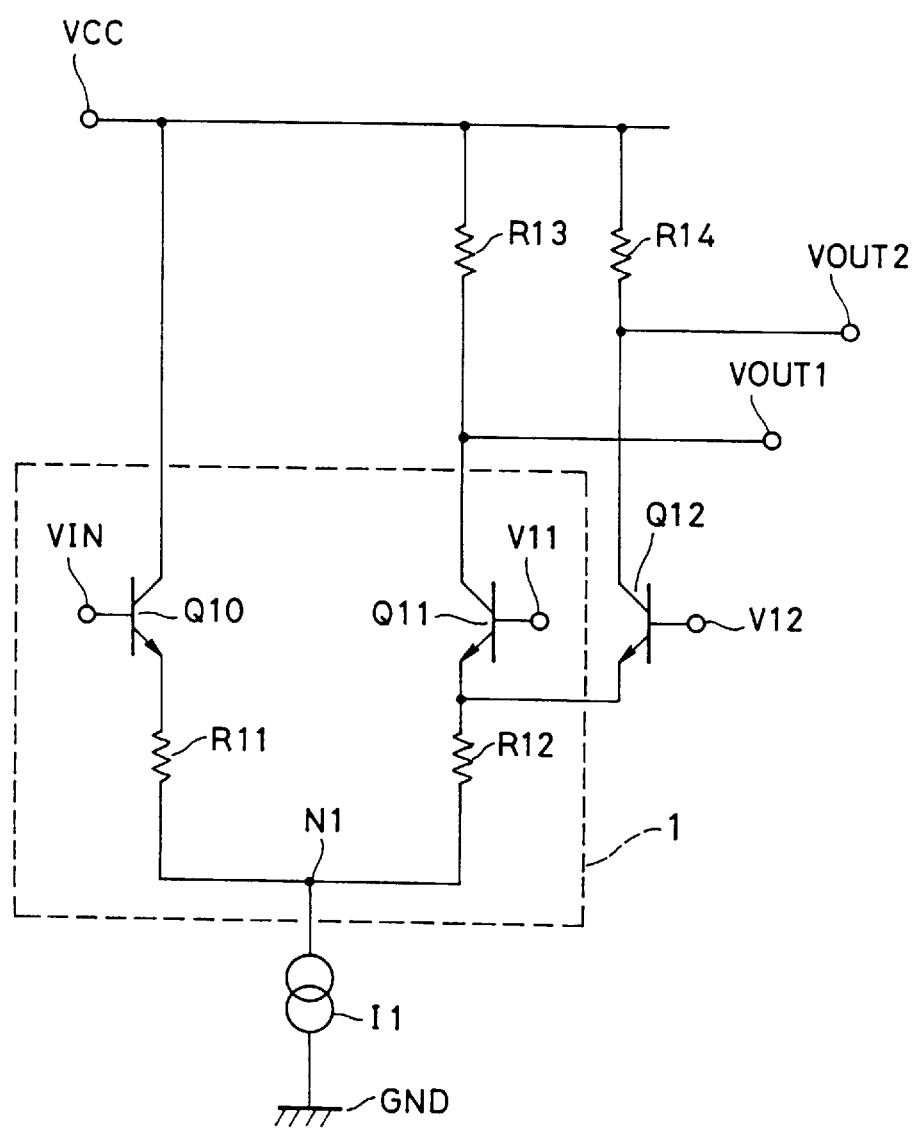
FIG. 2 is a circuit diagram showing a construction of the second embodiment of a variable gain amplifier circuit according to the present invention.

Next, the second embodiment of the variable gain amplifier circuit will be discussed with reference to FIG. 2. FIG. 2 shows the circuit diagram of the second embodiment of the variable gain amplifier circuit according to the present invention, in which like components to those in FIG. 1 will be identified by like reference numerals. In FIG. 2, a collector load resistor R14 is additionally connected between the collector of the transistor Q12 and the high potential power source terminal VCC in the circuit of FIG. 1. Then, with the load resistors R13 and R14, two outputs VOUT1 and VOUT2 are lead out.

Other circuit construction is the same as the first embodiment of FIG. 1 and thus discussion for those common part of the circuit is neglected for keeping the disclosure simple enough to facilitate clear understanding of the invention.

A gain G22 of the second output signal VOUT2 of the shown embodiment of the variable gain amplifier circuit can be expressed by the following equation, since the gain G21 of the first output signal VOUT1 can be expressed by the foregoing equation (7):

$$G22 = \{R14/(R11+R12)\}/\{1+\exp((q/kT)\cdot(V12-V11))\} \quad (8)$$

As can be appreciated herefrom, the shown embodiment of the variable gain amplifier circuit can sequentially vary the gains, complimentarily.

Figure 3:
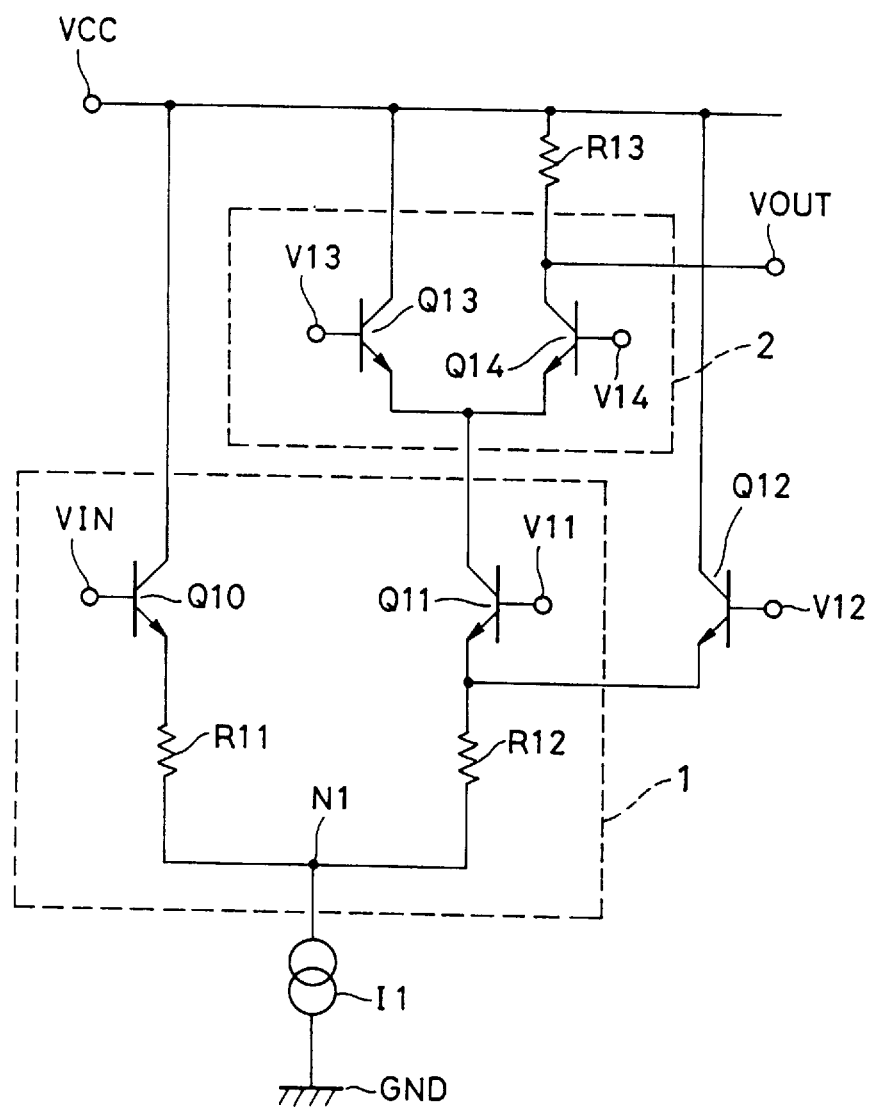
FIG. 3 is a circuit diagram showing a construction of the third embodiment of a variable gain amplifier circuit according to the present invention.
Figure 4:
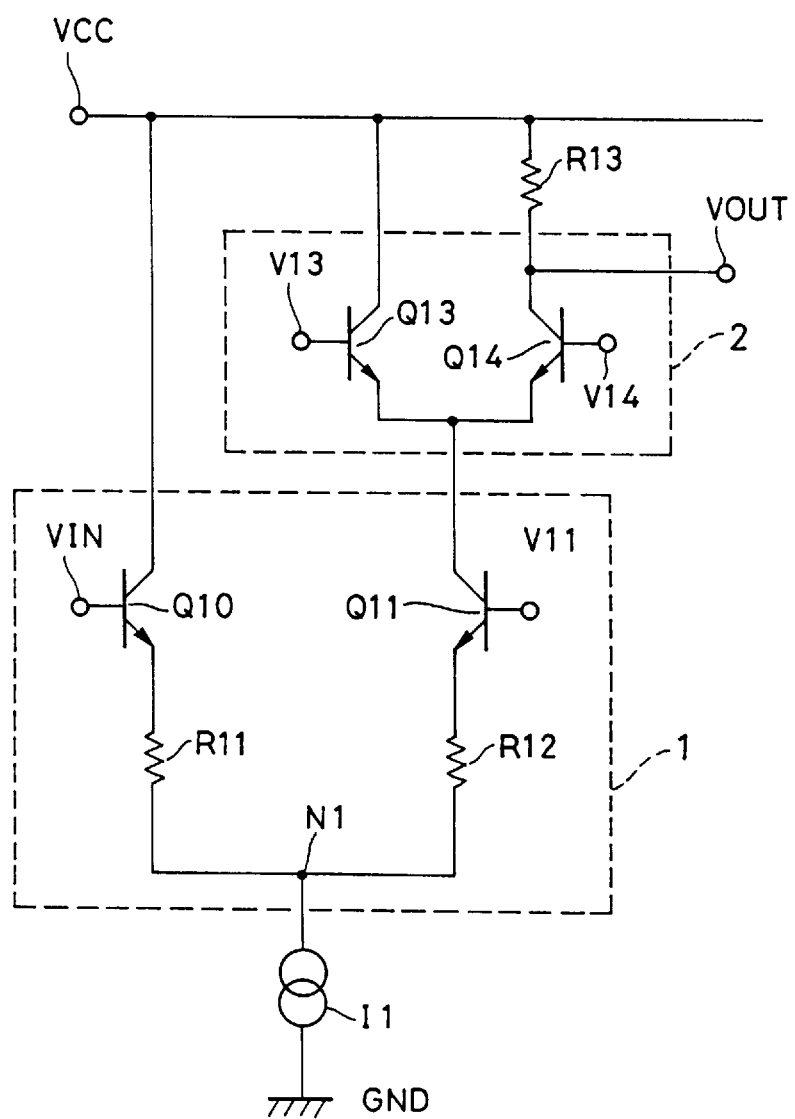
FIG. 4 is a circuit diagram showing one example of construction of the conventional variable gain amplifier circuit.
Figure 5:
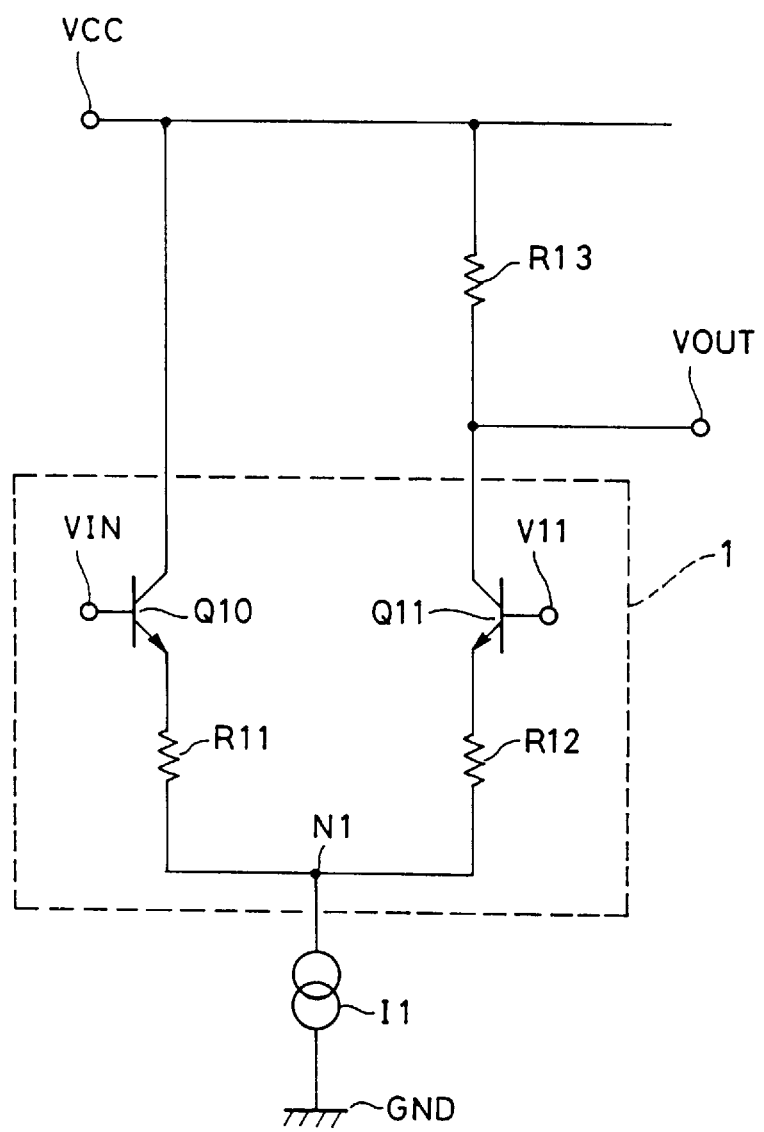
FIG. 5 is a circuit diagram showing one example of construction of a differential amplifier circuit with an emitter resistance.
Figure 6:
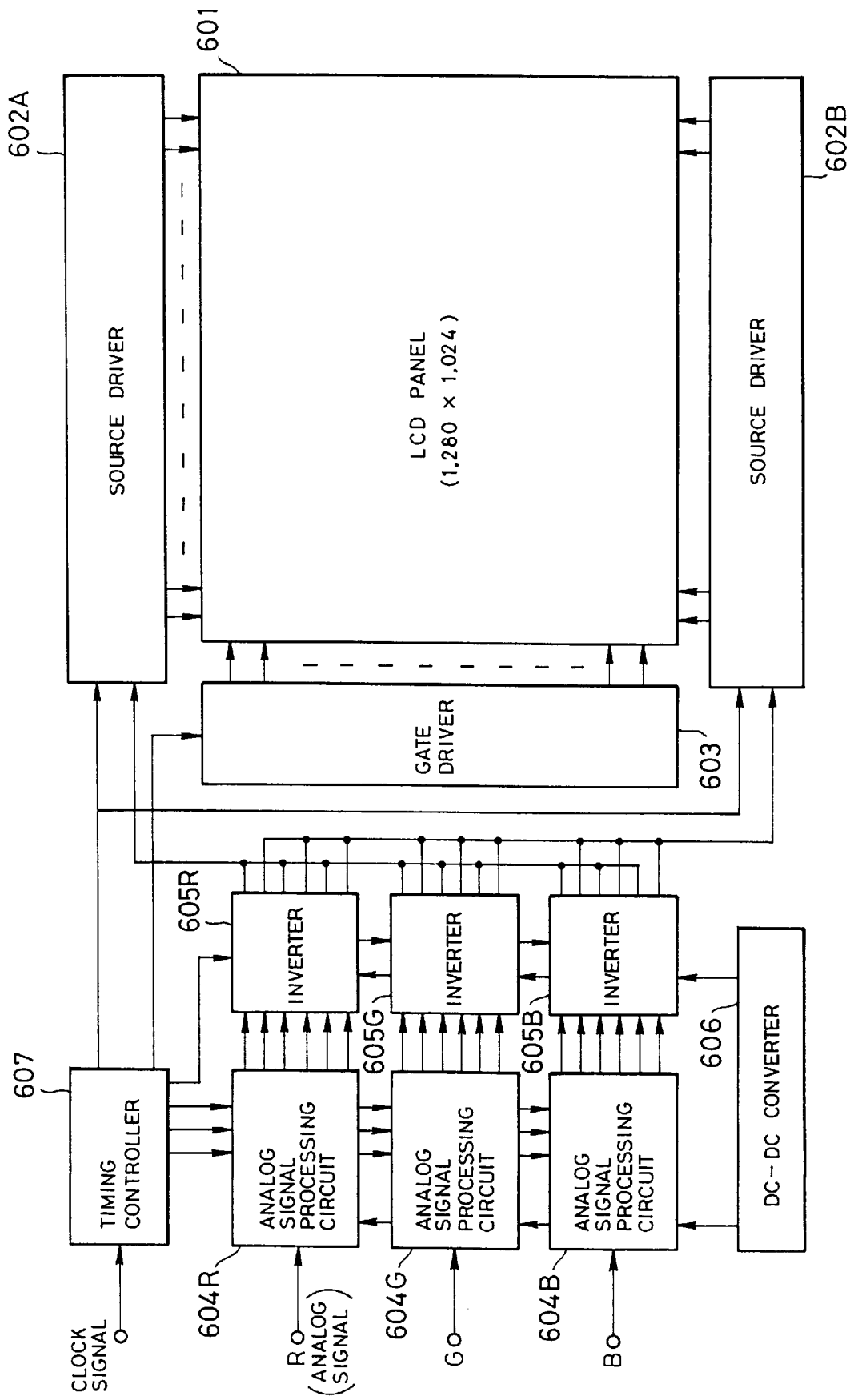
FIG. 6 is a block diagram showing a construction of a liquid crystal display device.

FIG. 3 is a circuit diagram of the third embodiment of the variable gain amplifier circuit according to the present invention, in which like components to those in FIGS. 1, 2 and 4 will be identified by like reference numerals. The shown embodiment is application of the present invention for the circuit of FIG. 4. Namely, for the circuit of FIG. 4, the transistor Q12 is added for controlling emitter current of the transistor Q11.

The emitter of the transistor Q12 is connected to the emitter of the transistor Q11, and a constant voltage V12 is applied to the base thereof. The collector of the transistor Q12 is connected to the high potential power source terminal VCC.

The shown embodiment of the variable gain amplifier circuit makes a gain G3 of the variable gain amplifier circuit variable by respective of the constant voltages V13 and V14, and further by respective of the constant voltages V11 and V12.

In concrete, the gain G3 is at first controlled by the constant voltages V13 and V14 to be $\{R13/(R11+R12)\}/\{1+\exp((q/kT)\cdot(V13+V14))\}$, and is further controlled by the constant voltages V11 and V12. Therefore, the gain G3 can be expressed by $$G3 = \{R13/(R11+R12)\}/[\{1+\exp((q/kT)\cdot(V13-V14))\}\cdot\{(1+\exp((q/kT)\cdot(V11-V12))\}] \quad (9)$$

The shown embodiment of the variable gain amplifier circuit may use two kinds of control voltages. Therefore, gain to be obtained can be controlled precisely.

It should be noted that, while the detailed description of the variable gain amplifier circuit according to the invention has been discussed in terms that the transistors employed are NPN type bipolar transistors for operation between the high potential power source VCC and a grounding potential GND, the present invention is of course applicable for the variable gain amplifier circuit employing PNP type bipolar transistors and using low potential power source.

Also, the variable gain amplifier circuit according to the present invention can be operated between the grounding potential GND and a negative potential VEE by setting the high potential power source VCC in the foregoing embodiment at the grounding potential GND and the low potential power source at the negative potential VEE.

As described above, according to the present invention, the low power source voltage can be employed and the low power consumption can be achieved, since it is not necessary to applied to the base voltage of the output transistor for high voltage. Also, when the power source voltage (VCC) is equal to that in the conventional circuit, an amplitude of the output signal in the circuit according to the present invention is greater than that of the conventinal circuit.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A variable gain amplifier circuit comprising:
   a first transistor having a base supplied with an input signal, a collector connected to a power source terminal and an emitter connected to a circuit node;
   a second transistor having a base supplied with a first constant voltage, and an emitter connected to said circuit node;
   a constant current source supplying a constant current to said circuit node;
   a first load provided between a collector of said second transistor and said power source terminal;
   a third transistor having an emitter connected to said emitter of said second transistor, and a base supplied with a second constant voltage for controlling an emitter current of said second transistor; and
   first and second resistors provided between respective emitters of said first and second transistors,
   wherein a circuit gain is controlled by controlling at least one of said first and second constant voltages.

2. A variable gain amplifier circuit as set forth in claim 1, wherein the collector of said third transistor is connected to said power source terminal.

3. A variable gain amplifier circuit as set forth in claim 1, which further comprises a second load provided between a collector of said third transistor and said power source terminal, and two output voltage terminals from respective ones of said first and second loads.

4. A variable gain amplifier circuit as set forth in claim 3, wherein said first and second loads are resistors.

5. a variable gain amplifier circuit comprising:
   a first transistor having a base supplied with an input signal, a collector connected to a power source terminal and a emitter connected to a circuit node;
   a second transistor having a base supplied with a first constant voltage, and an emitter connected to said circuit node;
   a constant current source supplying a constant current to said circuit node;
   a third transistor having an emitter connected to said emitter of said second transistor, and a base supplied with a second constant voltage for controlling an emitter current of said second transistor; and
   a collector current control circuit connected between the collector of said second transistor depending upon a control voltage,
   first and second resistors provided between respective emitters of said first and second transistors and said circuit node,
   wherein a circuit gain is controlled by controlling at least one of said first and second constant voltages and said control voltage.

6. A variable gain amplifier circuit as set forth in claim 5, wherein said collector current control circuit includes fourth and fifth transistors respectively having emitters connected to the collector of said second transistor, and bases of said fourth and fifth transistors are supplied third and fourth constant voltages as said control voltages, respectively.

7. (Amended) A variable gain amplifier circuit as set forth in claim 6, which further comprises a resistor provided between the collector of said fifth transistor and said power source terminal, and an output voltage terminal leading from said resistor.

* * * * *